(12) United States Patent
Lin et al.

(10) Patent No.: US 11,362,057 B2
(45) Date of Patent: Jun. 14, 2022

(54) CHIP PACKAGE STRUCTURE AND MANUFACTURING METHOD THEREOF

(71) Applicant: Unimicron Technology Corp., Taoyuan (TW)

(72) Inventors: Pu-Ju Lin, Hsinchu (TW); Cheng-Ta Ko, Taipei (TW); Ra-Min Tain, Hsinchu County (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/687,557

(22) Filed: Nov. 18, 2019

(65) Prior Publication Data

US 2021/0118839 A1   Apr. 22, 2021

(30) Foreign Application Priority Data

Oct. 22, 2019  (TW) ................................ 108138039

(51) Int. Cl.
*H01L 23/00* (2006.01)
*H01L 23/538* (2006.01)
*H01L 25/065* (2006.01)

(52) U.S. Cl.
CPC .......... *H01L 24/73* (2013.01); *H01L 23/5389* (2013.01); *H01L 24/24* (2013.01); *H01L 24/25* (2013.01); *H01L 24/81* (2013.01); *H01L 24/82* (2013.01); *H01L 24/92* (2013.01); *H01L 25/0655* (2013.01);
(Continued)

(58) Field of Classification Search
CPC ....... H01L 2224/24137; H01L 25/0655; H01L 23/5389; H01L 24/73; H01L 24/24; H01L 24/25; H01L 24/81; H01L 24/82; H01L 2224/24101; H01L 2224/24227; H01L 2224/25174; H01L 2224/48105; H01L 2224/48227; H01L 2224/73207
See application file for complete search history.

(56) References Cited

U.S. PATENT DOCUMENTS 9,812,429 B2   11/2017  Das et al.
9,941,207 B2   4/2018   Lin
(Continued)

FOREIGN PATENT DOCUMENTS

TW   I455281      10/2014
TW   201826485    7/2018

OTHER PUBLICATIONS

"Office Action of Taiwan Counterpart Application", dated Aug. 26, 2020, p. 1-p. 9.

*Primary Examiner* — Tucker J Wright
(74) *Attorney, Agent, or Firm* — JCIPRNET

(57) ABSTRACT

A chip package structure includes a substrate, at least two chips, a plurality of first pads, a plurality of first micro bumps, and a bridging element. The substrate has a first surface and a second surface opposite to the first surface. The two chips are disposed on the first surface of the substrate and are horizontally adjacent to each other. Each chip has an active surface. The first pads are disposed on the active surface of each of the chips. The first micro bumps are disposed on the first pads and have the same size. The bridging element is disposed on the first micro bumps such that one of the chips is electrically connected to another of the chips through the first pads, the first micro bumps, and the bridging element.

16 Claims, 7 Drawing Sheets

(52) U.S. Cl.
CPC ............... *H01L 2224/24101* (2013.01); *H01L 2224/24137* (2013.01); *H01L 2224/24227* (2013.01); *H01L 2224/25174* (2013.01); *H01L 2224/48105* (2013.01); *H01L 2224/48227* (2013.01); *H01L 2224/73207* (2013.01); *H01L 2224/73209* (2013.01); *H01L 2224/73227* (2013.01); *H01L 2224/81801* (2013.01); *H01L 2224/82005* (2013.01); *H01L 2224/82801* (2013.01); *H01L 2224/9211* (2013.01); *H01L 2224/92127* (2013.01); *H01L 2224/92137* (2013.01); *H01L 2224/92163* (2013.01); *H01L 2224/92164* (2013.01)

(56) References Cited

U.S. PATENT DOCUMENTS

| | | | |
|---|---|---|---|
| 10,535,608 B1* | 1/2020 | Rubin | H01L 24/17 |
| 10,930,633 B2* | 2/2021 | Chen | H01L 23/5389 |
| 2017/0125379 A1* | 5/2017 | Chen | H01L 23/49827 |
| 2017/0236794 A1 | 8/2017 | Wang et al. | |
| 2020/0006309 A1* | 1/2020 | Chen | H01L 23/5389 |

* cited by examiner

CHIP PACKAGE STRUCTURE AND MANUFACTURING METHOD THEREOF

CROSS-REFERENCE TO RELATED APPLICATION

This application claims the priority benefit of Taiwan application serial no. 108138039, filed on Oct. 22, 2019. The entirety of the above-mentioned patent application is hereby incorporated by reference herein and made a part of this specification.

BACKGROUND

Technical Field

The disclosure relates to a chip package structure and a manufacturing method thereof, and more particularly to a chip package structure having a bridging element and a manufacturing method thereof.

Description of Related Art

Conventionally, in a package structure in which a plurality of chips are interconnected, an embedded multi-die interconnect bridge (EMIB) technology disposes chips on a circuit carrier and uses an embedded bridging element embedded in the circuit carrier to connect different chips. Since the chip needs to be connected to the bridging element and the circuit carrier at the same time, and the size of the micro bumps of the chip connected to the bridging element is different from the size of the micro bumps of the chip connected to the circuit carrier, the yield of the chip during assembly is not high.

SUMMARY

The disclosure provides a chip package structure and a manufacturing method that can improve the yield of a multi-chip package and achieve the effect of high-density connection.

A chip package structure of the disclosure includes a substrate, at least two chips, a plurality of first pads, a plurality of first micro bumps, and a bridging element. The substrate has a first surface and a second surface opposite to the first surface. The two chips are disposed on the first surface of the substrate and are horizontally adjacent to each other. Each of the chips has an active surface. The first pads are disposed on the active surface of each of the chips. The first micro bumps are disposed on the first pads, and all the first micro bumps have the same size. The bridging element is disposed on the first micro bumps such that one of the chips is electrically connected to another of the chips through the first pads, the first micro bumps, and the bridging element.

In an embodiment of the disclosure, the bridging element and the substrate are respectively located on two opposite sides of the chips.

In an embodiment of the disclosure, the active surface of one of the chips is flush with the active surface of another of the chips.

In an embodiment of the disclosure, the bridging element includes at least one dielectric layer, at least two patterned circuit layers, and at least one first conductive via. The patterned circuit layers and the dielectric layer are sequentially stacked on the first micro bumps. The first conductive via penetrates the dielectric layer. One of the patterned circuit layers is electrically connected to another of the patterned circuit layers through the first conductive via.

In an embodiment of the disclosure, a line width of the patterned circuit layers is 2 micrometers to 5 micrometers, and a line pitch of the patterned circuit layers is 2 micrometers to 5 micrometers.

In an embodiment of the disclosure, the chip package structure further includes a plurality of second pads, a plurality of third pads, and a plurality of wires. The second pads are disposed on the first surface of the substrate and are located on a periphery of the chips. The third pads are disposed on the active surface of each of the chips and are located on a periphery of the first pads. The wires connect the second pads and the third pads such that the chips are electrically connected to the substrate.

In an embodiment of the disclosure, the chip package structure further includes a plurality of copper pillars and a plurality of second micro bumps. The copper pillars are disposed on the first surface of the substrate and are located on a periphery of the chips. The second micro bumps are disposed on the copper pillars such that the bridging element is electrically connected to the substrate through the second micro bumps and the copper pillars.

In an embodiment of the disclosure, the chip package structure further includes a connection structure and a plurality of second micro bumps. The connection structure is disposed on the substrate and is located on a periphery of the chips. The connection structure includes a second pad, an insulating material layer, a third pad, and a second conductive via. The second pad is disposed on the first surface of the substrate. The insulating material layer is disposed on the second pad. The third pad is disposed on the insulating material layer. The second conductive via penetrates the insulating material layer to electrically connect the second pad and the third pad. The second micro bumps are disposed on the connection structure such that the bridging element is electrically connected to the substrate through the second micro bumps and the connection structure.

In an embodiment of the disclosure, the chip package structure further includes a connection structure and a plurality of second micro bumps. The connection structure is disposed on the substrate and is located on a periphery of the chips. The connection structure includes a second pad, a conductive member, a third pad, an insulating material layer, a fourth pad, and a second conductive via. The second pad is disposed on the first surface of the substrate. The conductive member is disposed on the second pad. The third pad is disposed on the conductive member. The insulating material layer is disposed on the third pad. The fourth pad is disposed on the insulating material layer. The second conductive via penetrates the insulating material layer to electrically connect the third pad and the fourth pad. The second micro bumps are disposed on the connection structure such that the bridging element is electrically connected to the substrate through the second micro bumps and the connection structure.

A manufacturing method of a chip package structure of the disclosure includes the following steps. First, a substrate is provided. The substrate has a first surface and a second surface opposite to the first surface. Then, at least two chips are disposed on the first surface of the substrate. The two chips are horizontally adjacent to each other, and each of the chips has an active surface. Next, a plurality of first pads are formed on the active surface of each of the chips. Thereafter, a plurality of first micro bumps are formed on the first pads. All the first micro bumps having the same size. Lastly, a bridging element is disposed on the first micro bumps such that one of the chips is electrically connected to another of the chips through the first pads, the first micro bumps, and the bridging element.

In an embodiment of the disclosure, disposing the bridging element on the first micro bumps includes the following steps. First, a glass substrate is provided. Then, a release layer is formed on the glass substrate. Next, the bridging element is formed on the release layer. Lastly, the release layer and the glass substrate are removed to dispose the bridging element on the first micro bumps.

In an embodiment of the disclosure, the manufacturing method of the chip package structure further includes the following steps: forming a plurality of second pads on the first surface of the substrate such that the second pads are located on a periphery of the chips; forming a plurality of third pads on the active surface of each of the chips such that the third pads are located on a periphery of the first pads; and forming a plurality of wires to connect the second pads and the third pads such that the chips are electrically connected to the substrate.

In an embodiment of the disclosure, the manufacturing method of the chip package structure further includes the following steps: forming a plurality of copper pillars on the first surface of the substrate such that the copper pillars are located on a periphery of the chips; and forming a plurality of second micro bumps on the copper pillars such that the bridging element is electrically connected to the substrate through the second micro bumps and the copper pillars.

In an embodiment of the disclosure, the manufacturing method of the chip package structure further includes the following steps. First, a connection structure is formed on the substrate such that the connection structure is located on a periphery of the chips. The connection structure includes a second pad, an insulating material layer, a third pad, and a second conductive via. The second pad is disposed on the first surface of the substrate. The insulating material layer is disposed on the second pad. The third pad is disposed on the insulating material layer. The second conductive via penetrates the insulating material layer to electrically connect the second pad and the third pad. Next, a plurality of second micro bumps are formed on the connection structure such that the bridging element is electrically connected to the substrate through the second micro bumps and the connection structure.

In an embodiment of the disclosure, the manufacturing method of the chip package structure further includes the following steps. First, a connection structure is formed on the substrate such that the connection structure is located on a periphery of the chips. The connection structure includes a second pad, a conductive member, a third pad, an insulating material layer, a fourth pad, and a second conductive via. The second pad is disposed on the first surface of the substrate. The conductive member is disposed on the second pad. The third pad is disposed on the conductive member. The insulating material layer is disposed on the third pad. The fourth pad is disposed on the insulating material layer. The second conductive via penetrates the insulating material layer to electrically connect the third pad and the fourth pad. Next, a plurality of second micro bumps are formed on the connection structure such that the bridging element is electrically connected to the substrate through the second micro bumps and the connection structure.

Based on the above, in the chip package structure and the manufacturing method thereof of the embodiments, the chips horizontally adjacent to each other are assembled to the bridging element all through the first pads and the first micro bumps, and the first micro bumps all have the same size; therefore, the yield of packaging the multiple chips can be improved when the multiple chips are assembled.

DESCRIPTION OF THE EMBODIMENTS

FIGS. 1A to 1D are schematic cross-sectional views showing a manufacturing method of a chip package structure according to an embodiment of the disclosure.

Figure 1A:
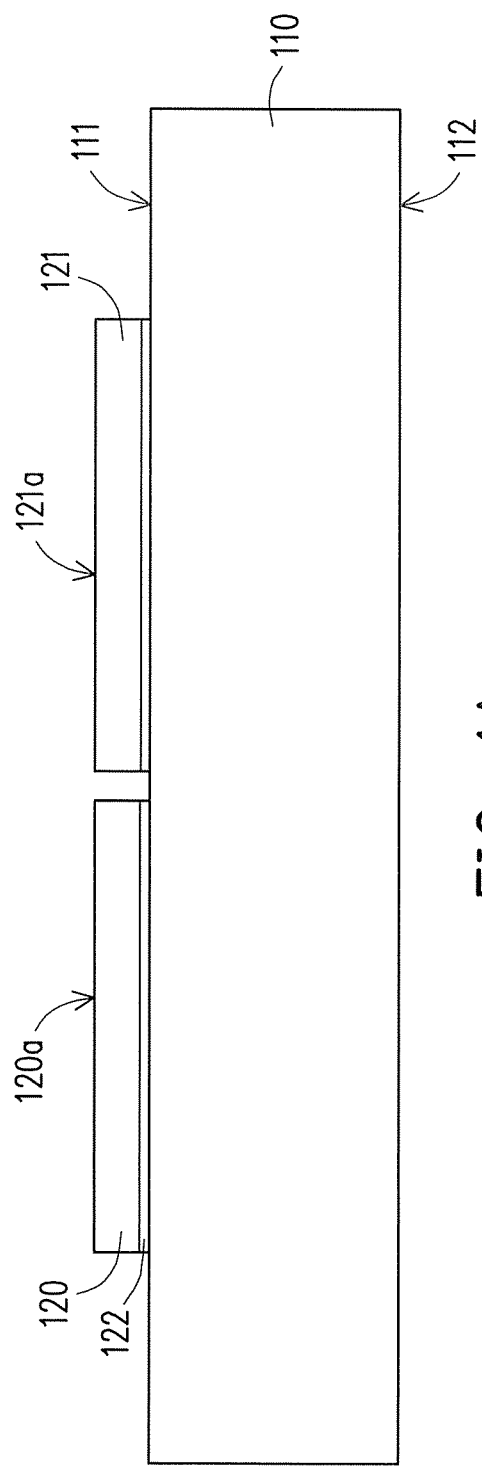
FIGS. 1A to 1D are schematic cross-sectional views showing a manufacturing method of a chip package structure according to an embodiment of the disclosure.

With reference to FIG. 1A, in the embodiment, first, a substrate 110 is provided. The substrate 110 has a first surface 111 and a second surface 112 opposite to the first surface 111. In the embodiment, the substrate 110 may be an organic substrate, an inorganic substrate, a ceramic substrate, a circuit board, a carrier, or a metal substrate, but it is not limited thereto.

With continued reference to FIG. 1A, next, at least two chips 120, 121 are disposed on the first surface 111 of the substrate 110. The chip 120 and the chip 121 are disposed horizontally adjacent to each other. The chip 120 has an active surface 120a, and the chip 121 has an active surface 121a. In some embodiments, the active surface 120a of one chip 120 is flush with the active surface 121a of the other chip 121. In some embodiments, the chips 120, 121 may be fixed to the substrate 110 with a die attach film (DAF) 122. Though the embodiment schematically illustrates two chips, the disclosure does not limit the number of the chips as long as the number of the chips is two or more.

Figure 1B:
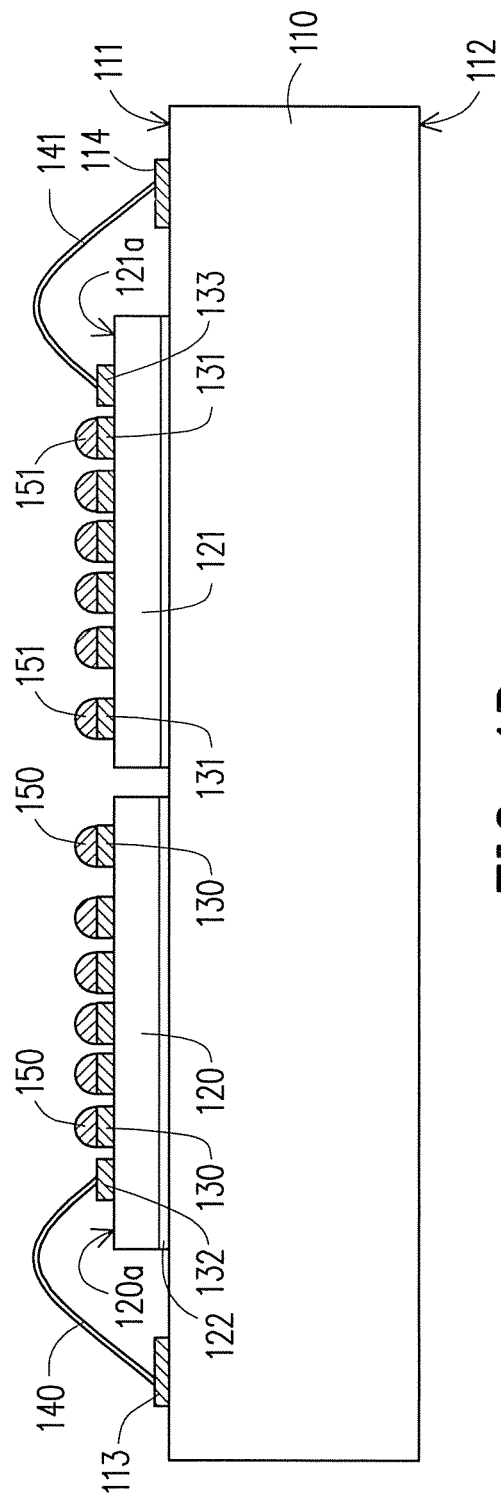

Then, with reference to FIG. 1B, a plurality of first pads 130, 131 are formed on the active surfaces 120a, 121a of the respective chips 120, 121 (generally, the first pads are completed when the manufacture of the chips is completed). In the embodiment, the first pads 130 are located on the active surface 120a of the chip 120, and the first pads 131 are located on the active surface 121a of the chip 121. In some embodiments, the first pads 130 contact the active surface 120a of the chip 120, and the first pads 131 contact the active surface 121a of the chip 121.

Next, with continued reference to FIG. 1B, a plurality of second pads 113, 114 are formed on the first surface 111 of the substrate 110 (generally, the second pads are completed when the substrate is formed), and a plurality of third pads 132, 133 are formed on the active surfaces 120a, 121a of the respective chips 120, 121 (generally, the third pads are completed when the manufacture of the chips is completed), and a plurality of wires 140, 141 are formed to connect the second pads 113, 114 and the third pads 132, 133. In the embodiment, the second pads 113 and the second pads 114 are disposed on the first surface 111 of the substrate 110 and are all located on the periphery of the chips 120, 121. The third pads 132 and the third pads 133 are respectively disposed on the active surfaces 120a, 121a of the respective chips 120, 121 and are all located on the periphery of the first pads 130, 131. The chip 120 may be electrically connected to the substrate 110 through the third pads 132, the wires 140, and the second pads 113. The chip 121 may be electrically connected to the substrate 110 through the third pads 133, the wires 141, and the second pads 114.

Then, a plurality of first micro bumps 150, 151 are formed on the first pads 130, 131 (the first micro bumps may also be completed when the manufacture of the chips is completed). In the embodiment, the first micro bumps 150 are located on the first pads 130, and the first micro bumps 151 are located on the first pads 131. The first micro bumps 150 contact the first pads 130, and the first micro bumps 151 contact the first pads 131. In the embodiment, the size of the first micro bumps 150 is the same as the size of the first micro bumps 151. The size of the first micro bumps 150, 151 is, for example, 10 micrometers to 80 micrometers, but it is not limited thereto.

Figure 1C:
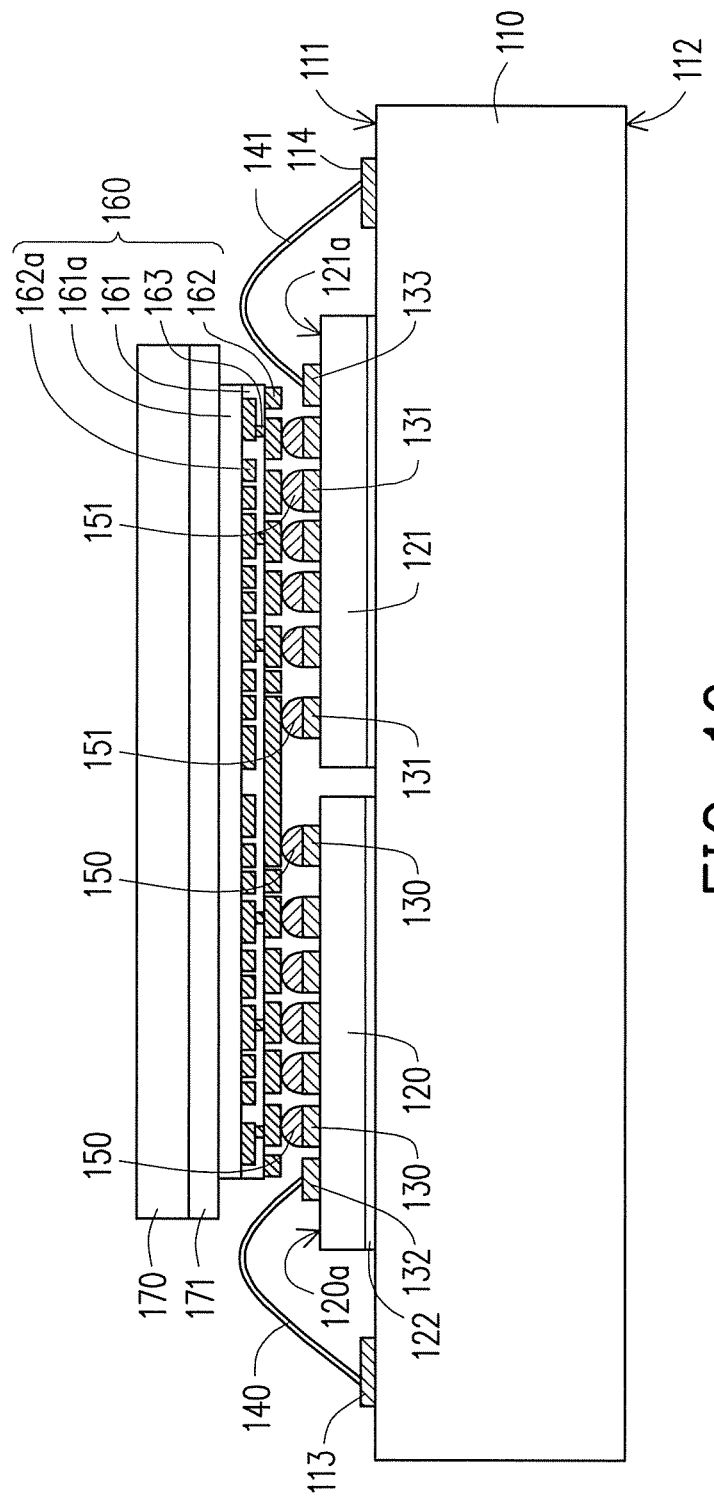

Then, with reference to FIG. 1C, a bridging element 160 is disposed on the first micro bumps 150, 151 such that one chip 120 may be electrically connected to the other chip 121 through the first pads 130, 131, the first micro bumps 150, 151, and the bridging element 160. In detail, in the embodiment, the step of disposing the bridging element 160 on the first micro bumps 150, 151 includes the following steps: First, a glass substrate 170 is provided. Then, a release layer 171 is formed on the glass substrate 170. Next, the bridging element 160 is formed on the release layer 171 such that the bridging element 160 and the glass substrate 170 are respectively located on two opposite sides of the release layer 171. In the embodiment, the bridging element 160 includes at least one dielectric layer 161, 161a, at least two patterned circuit layers 162, 162a, and at least one first conductive via 163. The patterned circuit layers 162, 162a and the dielectric layers 161, 161a are sequentially stacked on the first micro bumps 150, 151. The first conductive via 163 penetrates the dielectric layers 161, 161a such that one patterned circuit layer 162 is electrically connected to another patterned circuit layer 162a through the first conductive via 163. Lastly, the bridging element 160, the release layer 171, and the glass substrate 170 are disposed together on the first micro bumps 150, 151. In the embodiment, the bridging element 160 and the substrate 110 are respectively located on two opposite sides of the chips 120, 121.

In the embodiment, since the glass substrate 170 has high flatness and strength, ultrafine circuits can be manufactured on the glass substrate 170, and the effect of high-density connection can be obtained. In the embodiment, a line width of the patterned circuit layers 162, 162a is, for example, 2 micrometers to 5 micrometers, and a line pitch of the patterned circuit layers 162, 162a is, for example, 2 micrometers to 5 micrometers, but they are not limited thereto.

In the manufacturing method of the chip package structure of the embodiment, the bridging element 160 is disposed on the first micro bumps 150, 151 after the wires 140, 141 are formed to connect the second pads 113, 114 and the third pads 132, 133, but the disclosure does not limit the order of the two steps. In other words, in some embodiments, the bridging element 160 may be disposed on the first micro bumps 150, 151 first, and then the wires 140, 141 are formed thereafter.

Figure 1D:
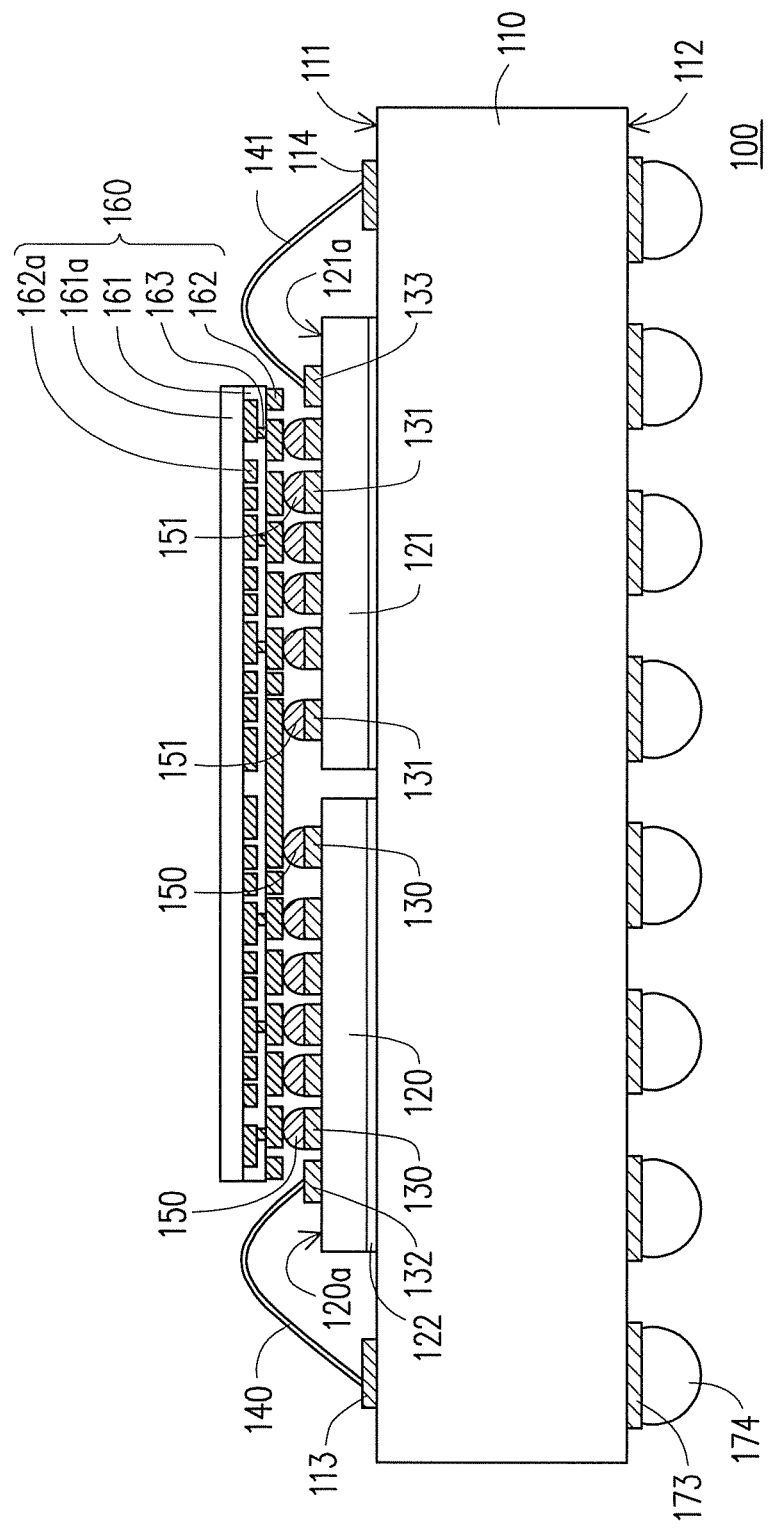

Next, with reference to FIG. 1D, the release layer 171 and the glass substrate 170 are removed, and pads 173 and connection terminals 174 are formed on the second surface 112 of the substrate 110. In some embodiments, the connection terminals 174 are, for example, solder balls and may be used for a ball grid array (BGA), but they are not limited thereto. At this time, the manufacture of the chip package structure 100 of the embodiment has been completed.

In short, the chip package structure 100 of the disclosure includes the substrate 110, the at least two chips 120, 121, the plurality of first pads 130, 131, the plurality of first micro bumps 150, 151, and the bridging element 160. The substrate 110 has the first surface 111 and the second surface 112 opposite to the first surface 111. The two chips 120, 121 are disposed on the first surface 111 of the substrate 110 and are horizontally adjacent to each other. The chips 120, 121 respectively have the active surfaces 120a, 121a. The first pads 130, 131 are disposed on the active surfaces 120a, 121a of the respective chips 120, 121. The first micro bumps 150, 151 are disposed on the first pads 130, 131. The bridging element 160 is disposed on the first micro bumps 150, 151 such that one chip 120 may be electrically connected to the other chip 121 through the first pads 130, 131, the first micro bumps 150, 151, and the bridging element 160.

In addition, in the chip package structure 100 and the manufacturing method thereof of the embodiment, the chips 120, 121 horizontally adjacent to each other are assembled to the bridging element 160 both through the first pads 130, 131 and the first micro bumps 150, 151, and the first micro bumps 150, 151 all have the same size; therefore, the yield of packaging the multiple chips 120, 121 can be improved when the multiple chips 120, 121 are assembled. Further, since the bridging element 160 includes the patterned circuit layers 162, 162a with fine circuits, the chip package structure 100 of the embodiment achieves the effect of high-density connection.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
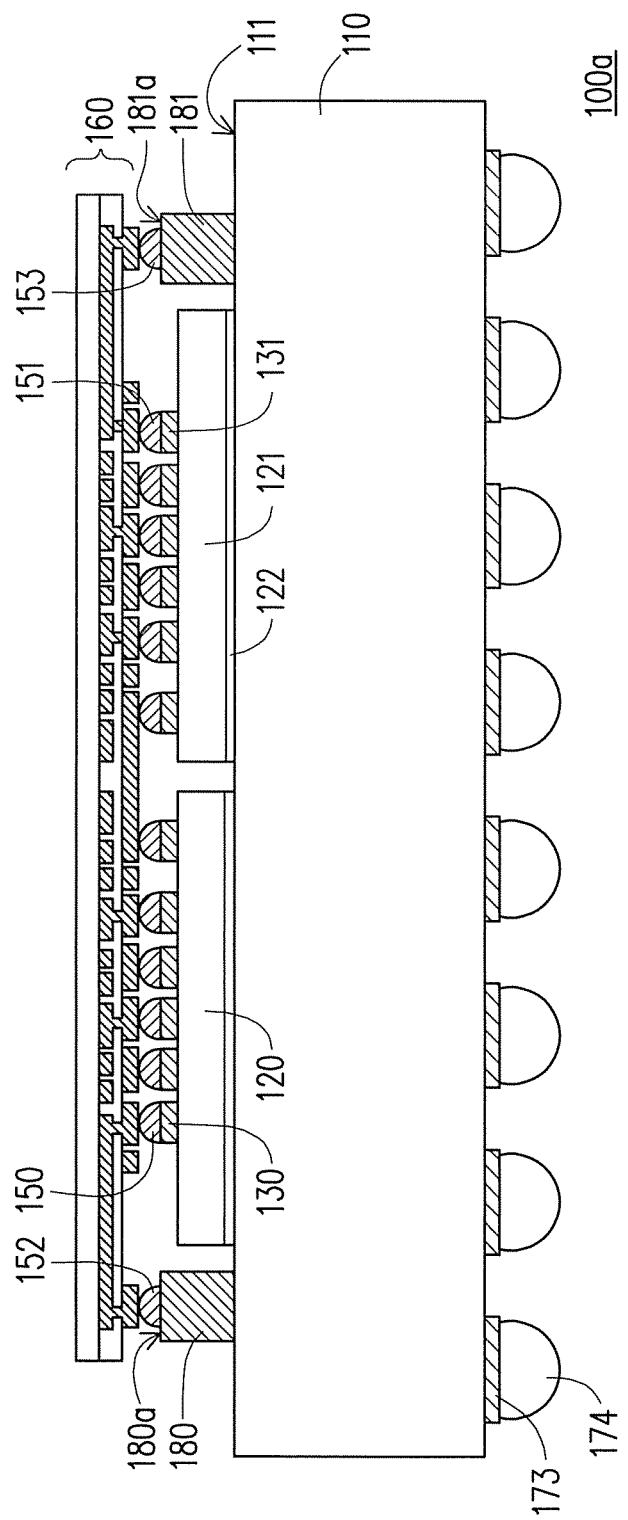
FIG. 2 is a schematic cross-sectional view showing a chip package structure according to another embodiment of the disclosure.

FIG. 2 is a schematic cross-sectional view showing a chip package structure according to another embodiment of the disclosure. With reference to both FIG. 1D and FIG. 2, the chip package structure 100a of this embodiment is similar to the chip package structure 100 of FIG. 1D, and the main difference between the two is that the chip package structure 100a of the embodiment further includes a plurality of copper pillars 180, 181 and a plurality of second micro bumps 152, 153, but it does not include the second pads 113, 114, the third pads 132, 133, and the wires 140, 141.

Specifically, with reference to FIG. 2, in the embodiment, the copper pillars 180, 181 are disposed on the first surface 111 of the substrate 110, and the copper pillars 180, 181 are located on the periphery of the chip 120 and the chip 121. The second micro bumps 152 are disposed on the copper pillars 180, and the second micro bumps 153 are disposed on the copper pillars 181. Thereby, the bridging element 160 may be electrically connected to the substrate 110 through the second micro bumps 152, 153 and the copper pillars 180, 181. That is, in the chip package structure 100a of the embodiment, the chips 120, 121 and the substrate 110 are electrically connected by the first pads 130, 131, the first micro bumps 150, 151, the bridging element 160, the second micro bumps 152, 153, and the copper pillars 180, 181, while in FIG. 1D, the chips 120, 121 and the substrate 110 are electrically connected by the third pads 132, 133, the wires 140, 141, and the second pads 113, 114. In some embodiments, top surfaces 180a of the copper pillars 180 are flush with surfaces of the first pads 130 facing the first micro bumps 150, and top surfaces 181a of the copper pillars 181 are flush with surfaces of the first pads 131 facing the first micro bumps 151. In some embodiments, the size of the second micro bumps 152, 153 is the same as the size of the first micro bumps 150, 151. In some embodiments, the copper pillars 180, 181 contact the first surface 111 of the substrate 110.

Figure 3:
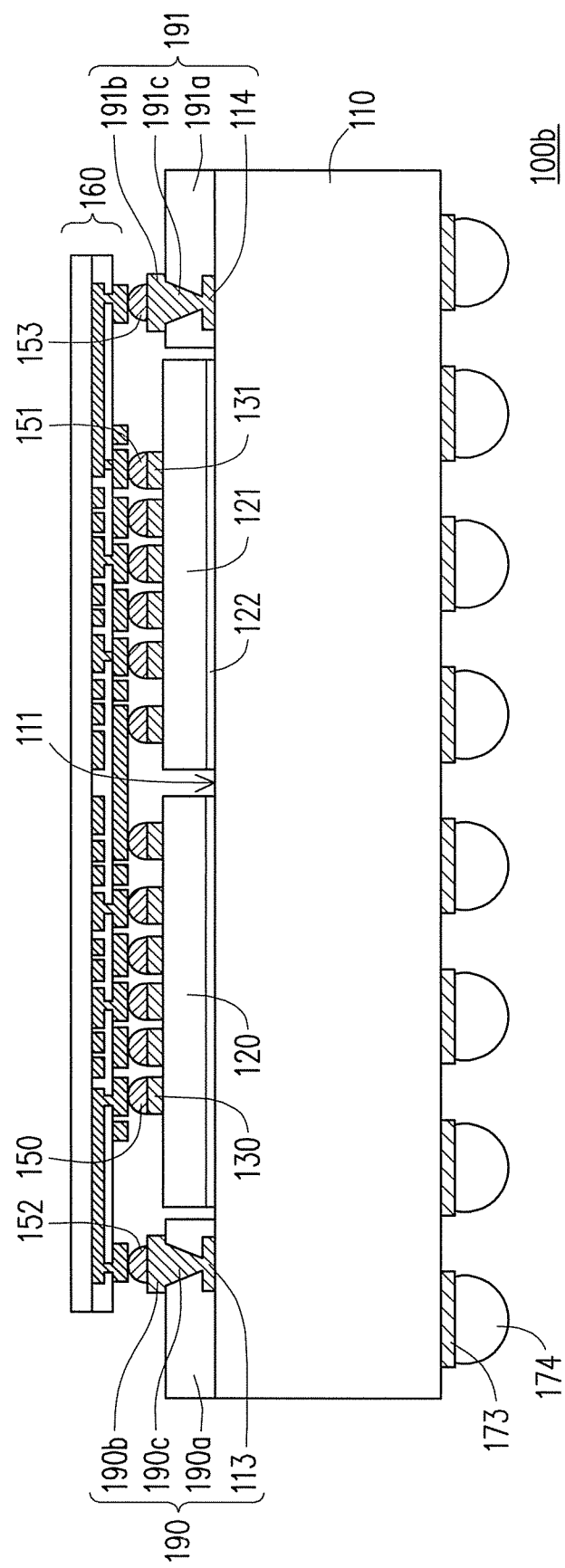
FIG. 3 is a schematic cross-sectional view showing a chip package structure according to another embodiment of the disclosure.

FIG. 3 is a schematic cross-sectional view showing a chip package structure according to another embodiment of the disclosure. With reference to both FIG. 2 and FIG. 3, the chip package structure 100b of this embodiment is similar to the chip package structure 100a of FIG. 2, and the main difference between the two is that the chip package structure 100b of the embodiment replaces the copper pillars 180, 181 in FIG. 2 with connection structures 190, 191.

Specifically, with reference to FIG. 3, in the embodiment, the connection structures 190, 191 are disposed on the first surface 111 of the substrate 110 and are located on the periphery of the chips 120, 121. The connection structures 190, 191 include the second pads 113, 114, insulating material layers 190a, 191a, third pads 190b, 191b, and second conductive vias 190c, 191c. The second pads 113, 114 are disposed on the first surface 111 of the substrate 110. The insulating material layers 190a, 191a are disposed on the second pads 113, 114 and cover the second pads 113, 114 and a part of the first surface 111. The third pads 190b, 191b are disposed on the insulating material layers 190a, 191a. The second conductive vias 190c, 191c penetrate the insulating material layers 190a, 191a to electrically connect the second pads 113, 114 and the third pads 190b, 191b. The second micro bumps 152, 153 are disposed on the connection structures 190, 191 such that the bridging element 160 may be electrically connected to the substrate 110 through the second micro bumps 152, 153 and the connection structures 190, 191. In some embodiments, the second pads 113, 114 contact the first surface 111 of the substrate 110. In some embodiments, a material of the insulating material layers 190a, 191a is, for example, ABF, polyimide, epoxy, silicone, but it is not limited thereto. In some embodiments, the chips 120, 121 may be disposed on the first surface 111 of the substrate 110 after the connection structure is formed on the first surface 111 of the substrate 110 and an opening is formed in the connection structure, and the chips 120, 121 are located in the opening.

Figure 4:
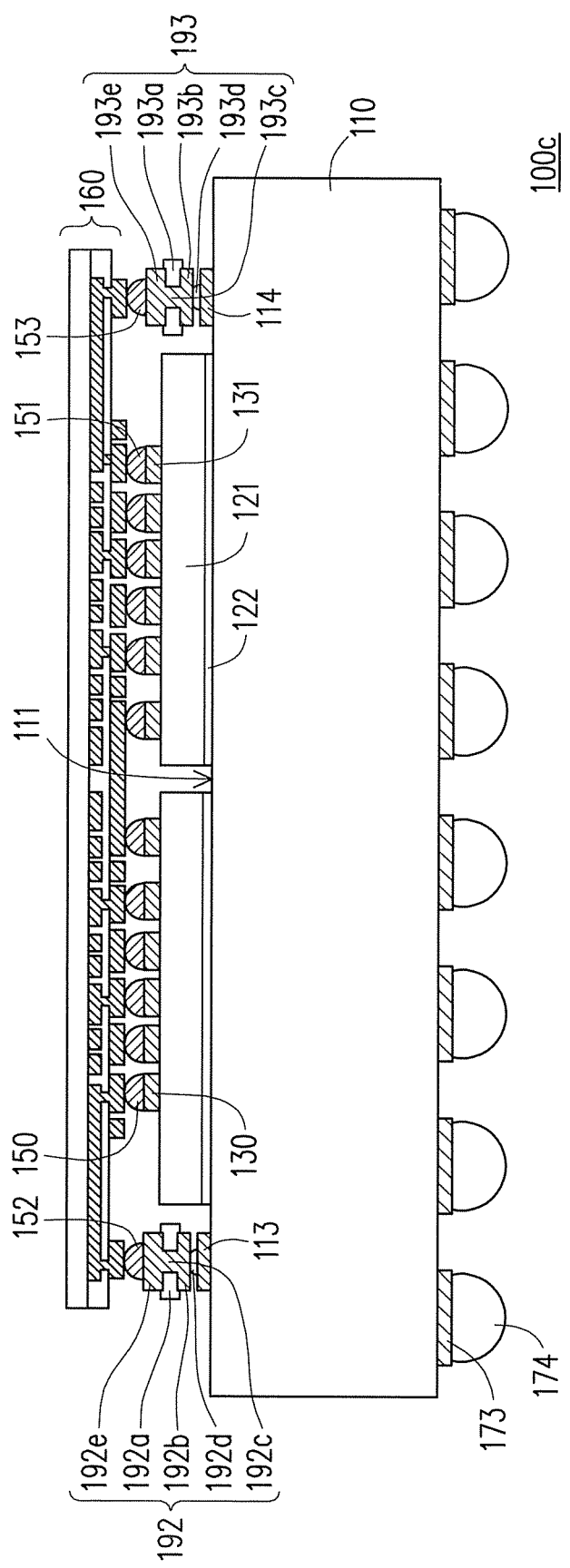
FIG. 4 is a schematic cross-sectional view showing a chip package structure according to another embodiment of the disclosure.

FIG. 4 is a schematic cross-sectional view showing a chip package structure according to another embodiment of the disclosure. With reference to both FIG. 2 and FIG. 4, the chip package structure 100c of this embodiment is similar to the chip package structure 100a of FIG. 2, and the main difference between the two is that the chip package structure 100c of the embodiment replaces the copper pillars 180, 181 in FIG. 2 with connection structures 192, 193.

Specifically, with reference to FIG. 4, in the embodiment, the connection structures 192, 193 are disposed on the first surface 111 of the substrate 110 and are located on the periphery of the chips 120, 121. The connection structures 192, 193 include the second pads 113, 114, conductive members 192d, 193d, third pads 192b, 193b, insulating material layers 192a, 193a, fourth pads 192e, 193e, and second conductive vias 192c, 193c. The second pads 113, 114 are disposed on the first surface 111 of the substrate 110. The conductive members 192d, 193d are disposed on the second pads 113, 114. The third pads 192b, 193b are disposed on the conductive members 192d, 193d. The insulating material layers 192a, 193a are disposed on the third pads 192b, 193b. The fourth pads 192e, 193e are disposed on the insulating material layers 192a, 193a. The second conductive vias 192c, 193c penetrate the insulating material layers 192a, 193a to electrically connect the third pads 192b, 193b and the fourth pads 192e, 193e. The second micro bumps 152, 153 are disposed on the connection structures 192, 193 such that the bridging element 160 is electrically connected to the substrate 110 through the second micro bumps 152, 153 and the connection structures 192, 193. In some embodiments, the second pads 113, 114 contact the first surface 111 of the substrate 110. In some embodiments, a material of the conductive members 192d, 193d is, for example, gold, silver, tin, copper or other alloy materials, but it is not limited thereto. In the embodiment, the connection structure 192 is exemplified by a two-layer board, and it may be a board of three layers or more in other embodiments, but it is not limited thereto.

In summary, in the chip package structure and the manufacturing method thereof of the embodiments, the chips horizontally adjacent to each other are assembled to the bridging element both through the first pads and the first micro bumps, and the first micro bumps all have the same size; therefore, the yield of packaging the multiple chips can be improved when the multiple chips are assembled. Further, since the bridging element includes the patterned circuit layers with fine circuits, the chip package structure of the embodiments achieves the effect of high-density connection.

What is claimed is:

1. A chip package structure, comprising:
   a substrate having a first surface and a second surface opposite to the first surface;
   at least two chips disposed on the first surface of the substrate and being horizontally adjacent to each other, wherein each of the chips having an active surface and a rear surface opposite to the active surface, the at least two chips are fixed to the substrate with a die attach film, the die attach film has a first bonding surface and a second bonding surface opposite to the first bonding surface, the first bonding surface of the die attach film directly contacts the first surface of the substrate, and the second bonding surface directly contacts the rear surface of the each of the chips;
   a plurality of first pads disposed on the active surface of each of the chips;
   a plurality of first micro bumps disposed on the first pads, all the first micro bumps having the same size; and
   a bridging element disposed on the first micro bumps such that one of the chips is electrically connected to another of the chips through the first pads, the first micro bumps, and the bridging element,
   wherein the bridging element and the substrate are respectively located on two opposite sides of the chips, and the chips are electrically connected to the substrate.

2. The chip package structure according to claim 1, wherein the active surface of one of the chips is flush with the active surface of another of the chips.

3. The chip package structure according to claim 1, wherein the bridging element comprises at least one dielectric layer, at least two patterned circuit layers, and at least one first conductive via,
   the patterned circuit layers and the dielectric layer are sequentially stacked on the first micro bumps,
   the first conductive via penetrates the dielectric layer, and one of the patterned circuit layers is electrically connected to another of the patterned circuit layers through the first conductive via.

4. The chip package structure according to claim 3, wherein a line width of the patterned circuit layers is 2 micrometers to 5 micrometers, and a line pitch of the patterned circuit layers is 2 micrometers to 5 micrometers.

5. The chip package structure according to claim 1, further comprising:
   a plurality of second pads disposed on the first surface of the substrate and located on a periphery of the chips;
   a plurality of third pads disposed on the active surface of each of the chips and located on a periphery of the first pads; and
   a plurality of wires connecting the second pads and the third pads such that the chips are electrically connected to the substrate.

6. The chip package structure according to claim 1, further comprising:
   a plurality of copper pillars disposed on the first surface of the substrate and located on a periphery of the chips; and
   a plurality of second micro bumps disposed on the copper pillars such that the bridging element is electrically connected to the substrate through the second micro bumps and the copper pillars.

7. The chip package structure according to claim 1, further comprising:
   a connection structure disposed on the substrate and located on a periphery of the chips, wherein the connection structure comprises:
      a second pad disposed on the first surface of the substrate;
      an insulating material layer disposed on the second pad;
      a third pad disposed on the insulating material layer; and
      a second conductive via penetrating the insulating material layer to electrically connect the second pad and the third pad; and
   a plurality of second micro bumps disposed on the connection structure such that the bridging element is electrically connected to the substrate through the second micro bumps and the connection structure.

8. The chip package structure according to claim 1, further comprising:
   a connection structure disposed on the substrate and located on a periphery of the chips, wherein the connection structure comprises:
      a second pad disposed on the first surface of the substrate;
      a conductive member disposed on the second pad;
      a third pad disposed on the conductive member;
      an insulating material layer disposed on the third pad;
      a fourth pad disposed on the insulating material layer; and
      a second conductive via penetrating the insulating material layer to electrically connect the third pad and the fourth pad; and
   a plurality of second micro bumps disposed on the connection structure such that the bridging element is electrically connected to the substrate through the second micro bumps and the connection structure.

9. A manufacturing method of a chip package structure, comprising:
   providing a substrate which has a first surface and a second surface opposite to the first surface;
   disposing at least two chips on the first surface of the substrate, the chips being horizontally adjacent to each other, wherein each of the chips having an active surface and a rear surface opposite to the active surface, the at least two chips are fixed to the substrate with a die attach film, the die attach film has a first bonding surface and a second bonding surface opposite to the first bonding surface, the first bonding surface of the die attach film directly contacts the first surface of the substrate, and the second bonding surface directly contacts the rear surface of the each of the chips;
   forming a plurality of first pads on the active surface of each of the chips;
   forming a plurality of first micro bumps on the first pads, all the first micro bumps having the same size; and
   disposing a bridging element on the first micro bumps such that one of the chips is electrically connected to another of the chips through the first pads, the first micro bumps, and the bridging element,
   wherein the bridging element and the substrate are respectively located on two opposite sides of the chips, and the chips are electrically connected to the substrate.

10. The manufacturing method of the chip package structure according to claim 9, wherein disposing the bridging element on the first micro bumps comprises:
    providing a glass substrate;
    forming a release layer on the glass substrate;
    forming the bridging element on the release layer; and
    removing the release layer and the glass substrate to dispose the bridging element on the first micro bumps.

11. The manufacturing method of the chip package structure according to claim 9, wherein the active surface of one of the chips is flush with the active surface of another of the chips.

12. The manufacturing method of the chip package structure according to claim 9, wherein the bridging element comprises at least one dielectric layer, at least two patterned circuit layers, and at least one first conductive via,
    the patterned circuit layers and the dielectric layer are sequentially stacked on the first micro bumps,
    the first conductive via penetrates the dielectric layer, and
    one of the patterned circuit layers is electrically connected to another of the patterned circuit layers through the first conductive via.

13. The manufacturing method of the chip package structure according to claim 9, further comprising:
    forming a plurality of second pads on the first surface of the substrate such that the second pads are located on a periphery of the chips;
    forming a plurality of third pads on the active surface of each of the chips such that the third pads are located on a periphery of the first pads; and
    forming a plurality of wires to connect the second pads and the third pads such that the chips are electrically connected to the substrate.

14. The manufacturing method of the chip package structure according to claim 9, further comprising:
    forming a plurality of copper pillars on the first surface of the substrate such that the copper pillars are located on a periphery of the chips; and
    forming a plurality of second micro bumps on the copper pillars such that the bridging element is electrically connected to the substrate through the second micro bumps and the copper pillars.

15. The manufacturing method of the chip package structure according to claim 9, further comprising:
    forming a connection structure on the substrate such that the connection structure is located on a periphery of the chips, wherein the connection structure comprises:
       a second pad disposed on the first surface of the substrate;
       an insulating material layer disposed on the second pad;

a third pad disposed on the insulating material layer; and a second conductive via penetrating the insulating material layer to electrically connect the second pad and the third pad; and forming a plurality of second micro bumps on the connection structure such that the bridging element is electrically connected to the substrate through the second micro bumps and the connection structure.

16. The manufacturing method of the chip package structure according to claim 9, further comprising:

forming a connection structure on the substrate such that the connection structure is located on a periphery of the chips, wherein the connection structure comprises:

a second pad disposed on the first surface of the substrate;

a conductive member disposed on the second pad;

a third pad disposed on the conductive member;

an insulating material layer disposed on the third pad;

a fourth pad disposed on the insulating material layer; and a second conductive via penetrating the insulating material layer to electrically connect the third pad and the fourth pad; and forming a plurality of second micro bumps on the connection structure such that the bridging element is electrically connected to the substrate through the second micro bumps and the connection structure.

\* \* \* \* \*